US008688060B2

(12) United States Patent
Sudjian

(10) Patent No.: US 8,688,060 B2
(45) Date of Patent: Apr. 1, 2014

(54) DETECTION CIRCUIT FOR OVERDRIVE CONDITIONS IN A WIRELESS DEVICE

(75) Inventor: Douglas Sudjian, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 793 days.

(21) Appl. No.: 12/487,549

(22) Filed: Jun. 18, 2009

(65) Prior Publication Data

US 2010/0321096 A1    Dec. 23, 2010

(51) Int. Cl.
*H01Q 11/12* (2006.01)
*H04K 3/00* (2006.01)

(52) U.S. Cl.
USPC ...................................... 455/127.1; 455/115.1

(58) Field of Classification Search
USPC .......................... 455/115.1, 115.3, 126, 127.1
See application file for complete search history.

(56) References Cited

U.S. PATENT DOCUMENTS

| 7,469,133 B2 * | 12/2008 | Zhang .......................... 455/234.1 |
| 2003/0052726 A1 * | 3/2003 | Shkap ............................. 327/350 |
| 2005/0287966 A1 | 12/2005 | Yoshimi et al. |
| 2006/0097326 A1 | 5/2006 | Tsutsumi |
| 2007/0066250 A1 | 3/2007 | Takahashi et al. |
| 2008/0297256 A1 | 12/2008 | Eken et al. |
| 2011/0018624 A1 * | 1/2011 | Kobayashi et al. ........... 327/574 |

FOREIGN PATENT DOCUMENTS

| JP | 06252669 | 9/1994 |
| JP | 09046141 | 2/1997 |
| JP | 2004159123 A | 6/2004 |
| JP | 2005197860 A | 7/2005 |
| JP | 2006013753 A | 1/2006 |
| JP | 2006140228 A | 6/2006 |
| JP | 2008167017 A | 7/2008 |
| JP | 2009056642 A | 3/2009 |

OTHER PUBLICATIONS

International Search Report and Written Opinion—PCT/US2010/039275, International Search Authority—European Patent Office—Oct. 25, 2010.
Kenneth A Townsend, et al., "A Wideband Power Detection System Optimized for the UWB Spectrum" IEEE Journal of Solid-State Circuits, IEEE Service Center, Piscataway, NJ, US LNKD-DOI: 10.1109/JSSC.2008.2011032, vol. 44, No. 2, Feb. 1, 2009, pp. 371-381, XP011243163 ISSN: 0018-9200.

* cited by examiner

*Primary Examiner* — Lee Nguyen
(74) *Attorney, Agent, or Firm* — Ramin Mobarhan

(57) ABSTRACT

A detection circuit that can accurately detect signal peak is described. In an exemplary design, the detection circuit includes a bias voltage generator and a MOS transistor. The bias voltage generator provides a bias voltage as a function of temperature. The MOS transistor receives an input RF signal and the bias voltage and provides a rectified signal, which may be a linear function of the input RF signal and may have reduced deviation with temperature due to the bias voltage. The bias voltage generator may generate the bias voltage based on a temperature-dependent current having a slope selected to reduce deviation in the rectified signal with temperature. An offset canceller may cancel a reference voltage from the rectified signal and provide an output signal. A bulk bias generator may generate a bulk voltage for the bulk of the MOS transistor as a function of temperature to improve operating speed at higher temperature.

26 Claims, 10 Drawing Sheets

DETECTION CIRCUIT FOR OVERDRIVE CONDITIONS IN A WIRELESS DEVICE

BACKGROUND

I. Field

The present disclosure relates generally to electronics, and more specifically to a detection circuit.

II. Background

A wireless communication device typically includes a transmitter to support data transmission. The transmitter typically has a power amplifier to amplify a radio frequency (RF) signal and provide high output power. The power amplifier may be designed to drive a particular load impedance, e.g., 50 Ohms. The load impedance may vary due to various types of disturbances and may cause an overdrive condition, which is a condition in which the RF signal level exceeds a range that can ensure reliable operation of the power amplifier. It may be desirable to detect overdrive conditions so that corrective actions can be taken to protect the power amplifier and other circuitry.

DETAILED DESCRIPTION

The word "exemplary" is used herein to mean "serving as an example, instance, or illustration." Any design described herein as "exemplary" is not necessarily to be construed as preferred or advantageous over other designs.

A detection circuit that can accurately detect overdrive conditions is described herein. The detection circuit may be used for various electronics devices such as wireless communication devices, cellular phones, personal digital assistants (PDAs), handheld devices, wireless modems, laptop computers, cordless phones, Bluetooth devices, consumer electronics devices, etc. For clarity, the use of the detection circuit in a wireless communication device is described below.

Figure 1:
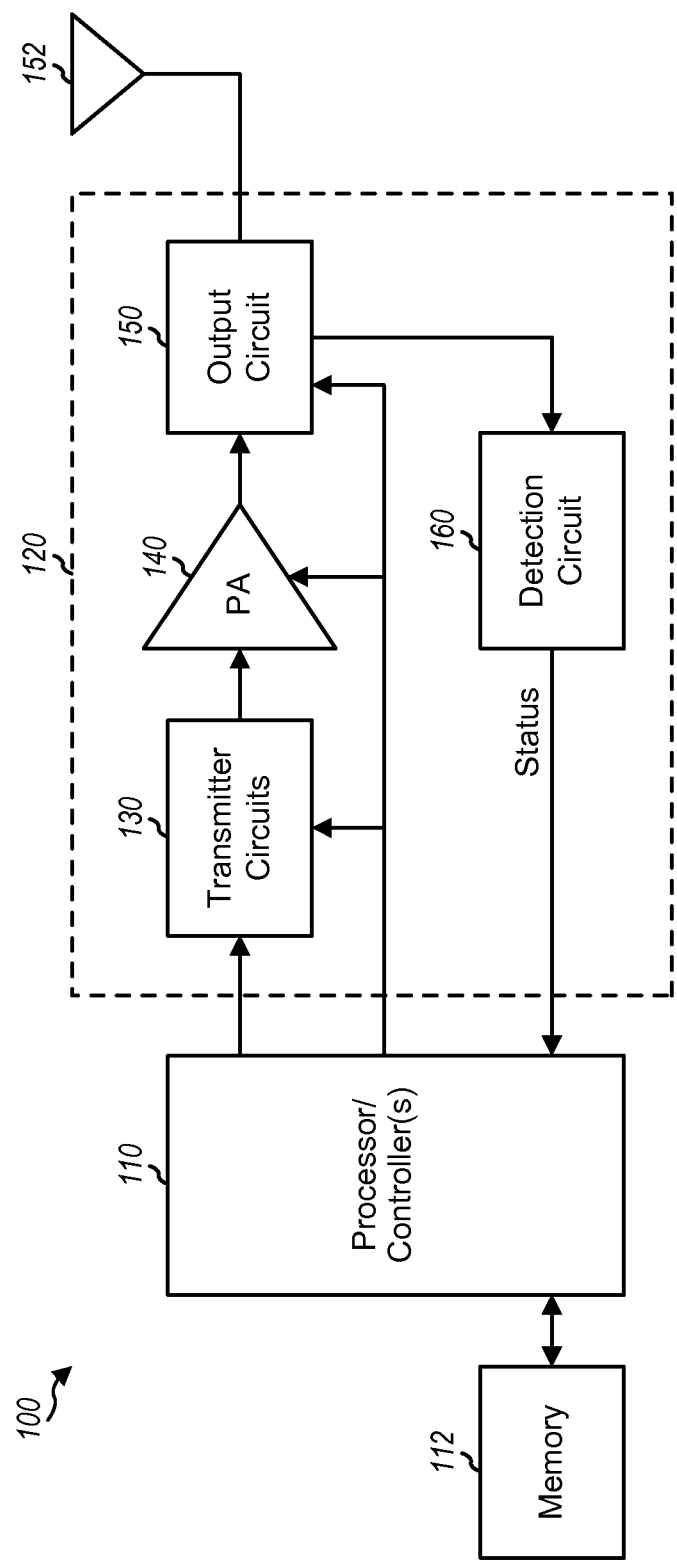
FIG. 1 shows a block diagram of a wireless communication device.

FIG. 1 shows a simplified block diagram of an exemplary design of a wireless communication device 100. In this exemplary design, wireless device 100 includes one or more processors/controllers 110, a memory 112, and a transmitter 120. In general, wireless device 100 may include any number of transmitters and any number of receivers for any number of communication systems and any number of frequency bands. Processor(s) 110 process data to be transmitted and provide an analog output signal to transmitter 120. Within transmitter 120, transmitter circuits 130 amplify, filter, and upconvert the analog output signal and provide an upconverted RF signal. A power amplifier (PA) 140 amplifies the upconverted RF signal to obtain the desired output power level and provides an output RF signal to an output circuit 150. Output circuit 150 routes the output RF signal to an antenna 152 and also couples the output RF signal to a detection circuit 160. Detection circuit 160 detects for overdrive conditions and provides a status signal indicative of detected overdrive conditions. Processor/controller(s) 110 may control the operation of transmitter circuits 130, power amplifier 140, and/or output circuit 150 based on the status signal from detection circuit 160 to ensure reliable operation of these circuits.

FIG. 1 shows an exemplary design of transmitter 120. In general, the conditioning of the signals in transmitter 120 may be performed by one or more stages of amplifier, filter, mixer, etc. All or a portion of transmitter 120 may be implemented on an analog integrated circuit (IC), an RF IC (RFIC), a mixed-signal IC, a complementary metal oxide semiconductor (CMOS) IC, etc.

Processor/controller(s) 110 may perform various functions for wireless device 100, e.g., processing for data to be transmitted. Processor/controller(s) 110 may also control the operation of various circuits within wireless device 100. Memory 112 may store program codes and data for processor/controller(s) 110. Processor/controller(s) 110 and memory 112 may be implemented on one or more application specific integrated circuits (ASICs) and/or other ICs.

Power amplifier 140 may be designed to drive a particular load impedance, e.g., 50 Ohms. Power amplifier 140 may be susceptible to changes in the load impedance due to disturbances of antenna 152 and/or its pattern. For example, disturbances may arise from human contact by a user based on proximity of hands, ears, and/or other body parts on wireless device 100. Disturbances may also result from antenna 152 becoming disconnected or shorted during operation of power amplifier 140. In any case, the disturbances may drastically change the load impedance observed by power amplifier 140. Under extreme load mismatch conditions, the signal swing from power amplifier 140 may become very large and may exceed a safe range for reliable operation. For example, the output signal level from power amplifier 140 with no load may be double the output signal level with a nominal load. The large output signal level may be especially problematic for CMOS circuits having lower peak operating voltages.

Detection circuit 160 may be used to detect for overdrive conditions and to trigger corrective actions when such conditions are detected in order to avoid damage to power amplifier 140. The corrective actions may include lowering the gain and/or input signal level of power amplifier 140, shutting down power amplifier 140 in extreme overdrive conditions, etc. Detection circuit 160 may also be referred to as a voltage standing wave radio (VSWR) protection circuit for a power amplifier.

Figure 2A:
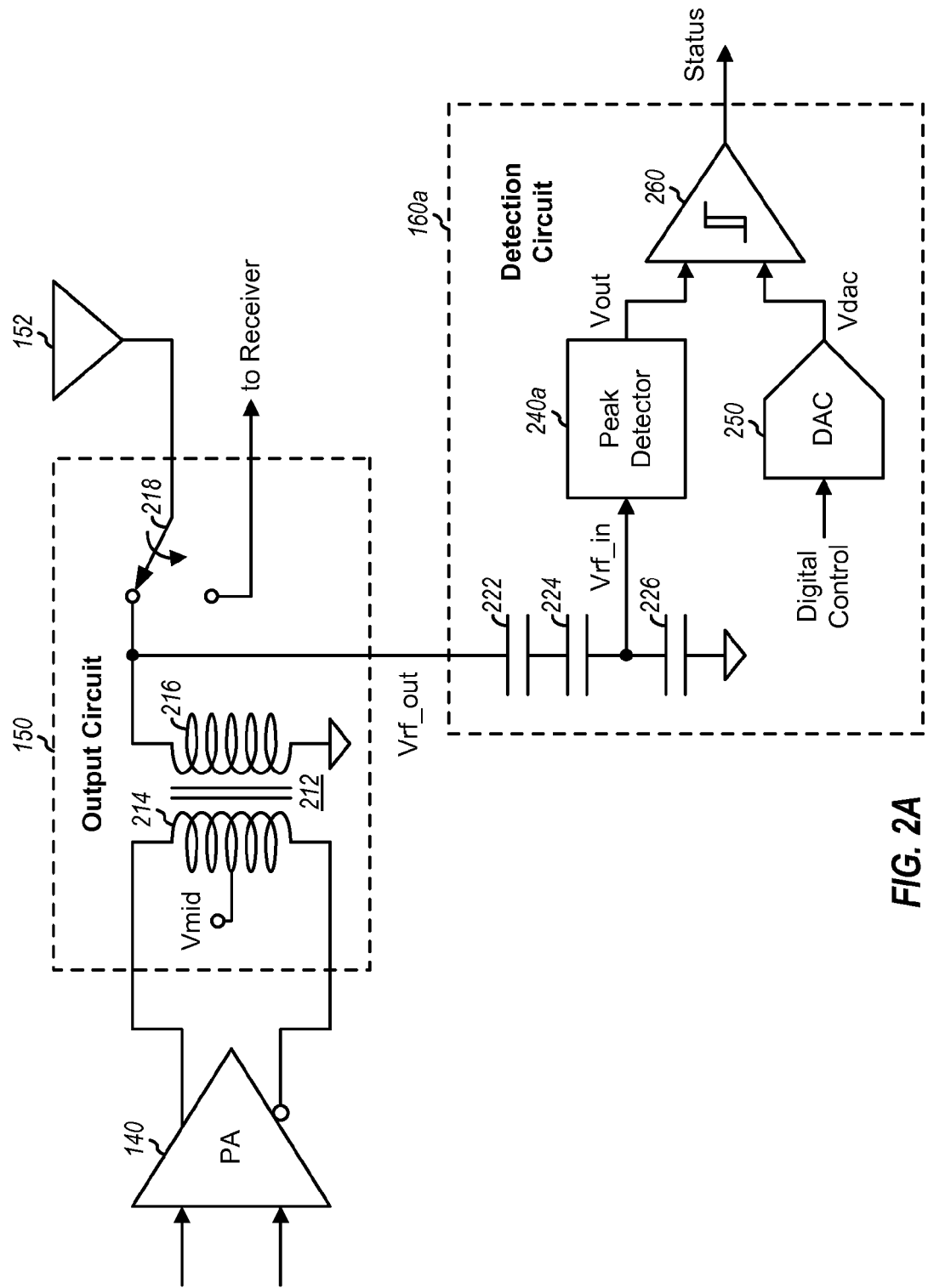
FIGS. 2A and 2B show block diagrams of an output circuit and a detection circuit.

FIG. 2A shows a block diagram of an exemplary design of output circuit 150 and a detection circuit 160a, which may be used for detection circuit 160 in FIG. 1. In the exemplary design shown in FIG. 2A, power amplifier 140 receives a differential upconverted RF signal and provides a differential output RF signal via an inverting output and a non-inverting output. Power amplifier 140 may provide high output power (e.g., up to 27 dBm or more) with a nominal load impedance.

Output circuit 150 includes a balun 212 comprising a primary coil 214 and a secondary coil 216. Primary coil 214 has its two ends coupled to the inverting and non-inverting outputs of power amplifier 140 and its center tap coupled to a mid voltage, Vmid. Secondary coil 216 has one end coupled to a switch 218 and the other end coupled to circuit ground. Balun 212 performs differential to single-ended conversion. Switch 218 can couple antenna 152 to either secondary coil 216 or a receiver (as shown in FIG. 2A) or some other circuit.

In the exemplary design shown in FIG. 2A, detection circuit 160a operates in a half-wave mode and receives a single-ended output RF signal, Vrf_out, which may be provided by secondary coil 216 within output circuit 150. Within detection circuit 160a, capacitors 222, 224 and 226 are coupled in series, with the top end of capacitor 222 receiving the output RF signal, and the bottom end of capacitor 226 being coupled to circuit ground. Capacitors 222, 224 and 226 operate as a power coupler and also as a voltage divider that can provide an input RF signal, Vrf_in, to a peak detector 240a. The input RF signal is an attenuated version of the output RF signal, which may be large during overdrive conditions. The voltage divider protects peak detector 240a from high voltage during overdrive conditions. In general, any number of capacitors may be used to form a voltage divider. A programmable voltage divider may also be formed with one or more capacitors (e.g., capacitor 226) having a configurable capacitance value. The capacitive divider ratio may be selected such that at the worst-case overdrive condition (e.g., due to extreme load impedance mismatch), the input voltage to peak detector 240a is voltage-limited for self-protection.

Peak detector 240a detects a peak voltage in the input RF signal and provides an output voltage, Vout, indicative of the detected peak voltage. The terms "voltage" and "signal" may be used interchangeably. A digital-to-analog converter (DAC) 250 receives a digital control and generates a threshold voltage, Vdac, based on the digital control. A comparator 260 receives the output voltage from peak detector 240a and the threshold voltage from DAC 250, compares the two voltages, and generates the status signal based on the result of the comparison.

Figure 2B:
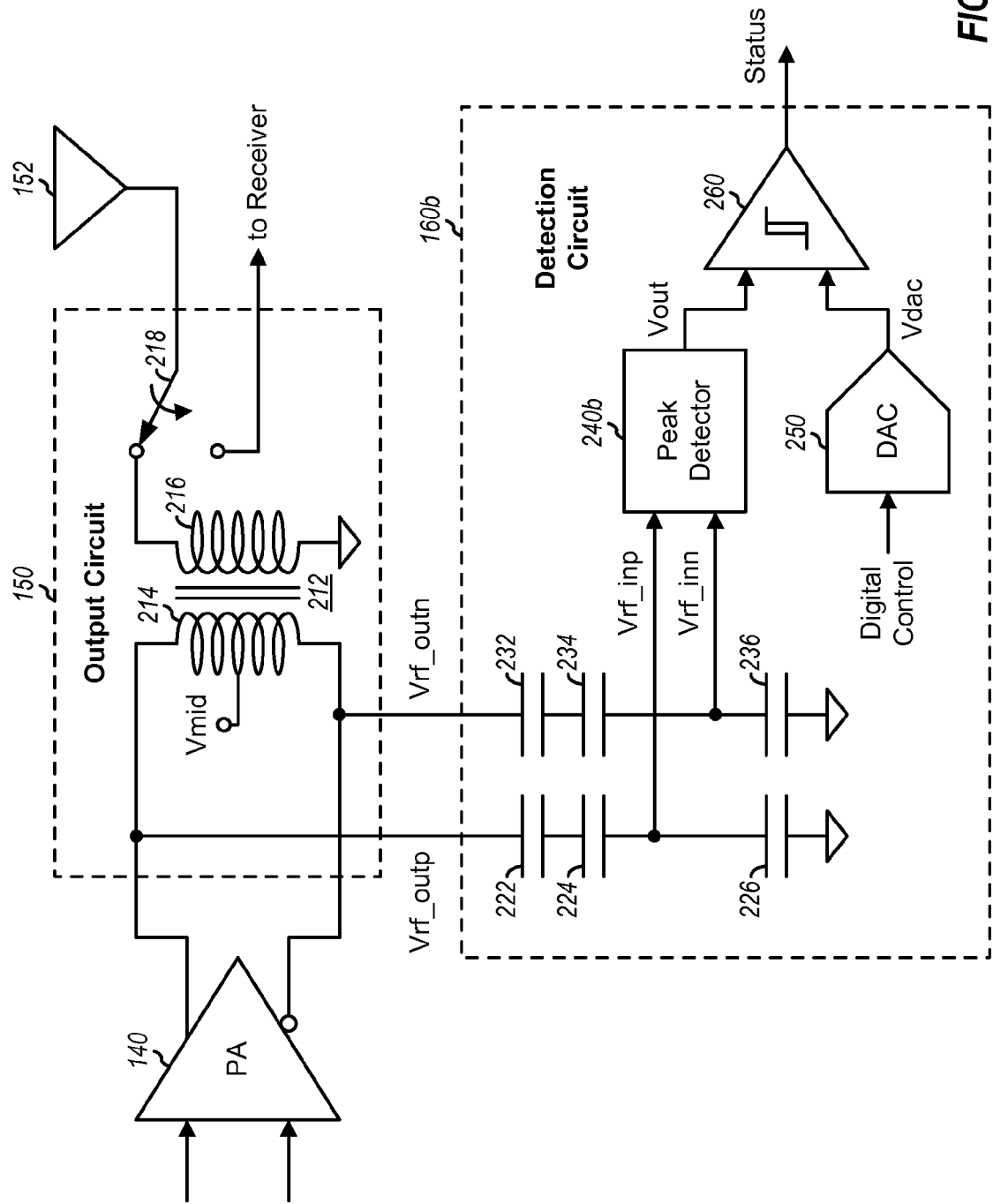

FIG. 2B shows a block diagram of an exemplary design of a detection circuit 160b, which may also be used for detection circuit 160 in FIG. 1. In this exemplary design, detection circuit 160b operates in a full-wave mode and receives a differential output RF signal comprising a Vrf_outp signal and a Vrf_outn signal, which may be provided by primary coil 214 within output circuit 150. Within detection circuit 160b, capacitors 222, 224 and 226 are coupled in series, with the top end of capacitor 222 receiving the Vrf_outp signal, and the bottom end of capacitor 226 being coupled to circuit ground. Capacitors 232, 234 and 236 are also coupled in series, with the top end of capacitor 232 receiving the Vrf_outn signal, and the bottom end of capacitor 236 being coupled to circuit ground. Each series combination of capacitors operates as a power coupler and a voltage divider.

A peak detector 240b receives a differential input RF signal comprising a Vrf_inp signal and a Vrf_inn signal from capacitors 226 and 236, respectively. Peak detector 240b detects a peak voltage in the differential input RF signal and provides an output voltage indicative of the detected peak voltage. DAC 250 receives a digital control and generates a threshold voltage. Comparator 260 compares the output voltage against the threshold voltage and generates the status signal.

A peak voltage is detected using only one half of a sinusoidal in the half-wave mode and using both halves of the sinusoidal in the full-wave mode. Ripples in a rectified signal may be smaller with full-wave rectification. Different threshold voltages may be used for the half-wave and full-wave modes to account for the difference in the ripples for the two modes. Using the half-wave mode at double the frequency may be equivalent to using the full-wave mode at half the frequency. Both cases may produce similar commutation voltage on a storage capacitor, but the input RF signal path should have increased bandwidth.

For simplicity, FIGS. 2A and 2B show a single DAC 250 and a single comparator 260. In general, any number of DACs and any number of comparators may be used to compare the output voltage from peak detector 240 against any number of threshold voltages and generate any number of status signals. For example, two threshold voltages may be used to detect for an extreme overdrive condition, a moderate overdrive condition, and a non-overdrive condition. Different corrective actions may be taken for different overdrive conditions. For example, the gain and/or input signal level of power amplifier 140 may be reduced for moderate overdrive condition, power amplifier 140 may be shut down for extreme overdrive condition, and the gain and/or input signal level of power amplifier 140 may be increased for non-overdrive condition. One or more threshold voltages may be used to define one or more signal levels corresponding to different overdrive conditions. The threshold voltage(s) may be programmable via the digital control provided to the DAC(s).

Figure 3:
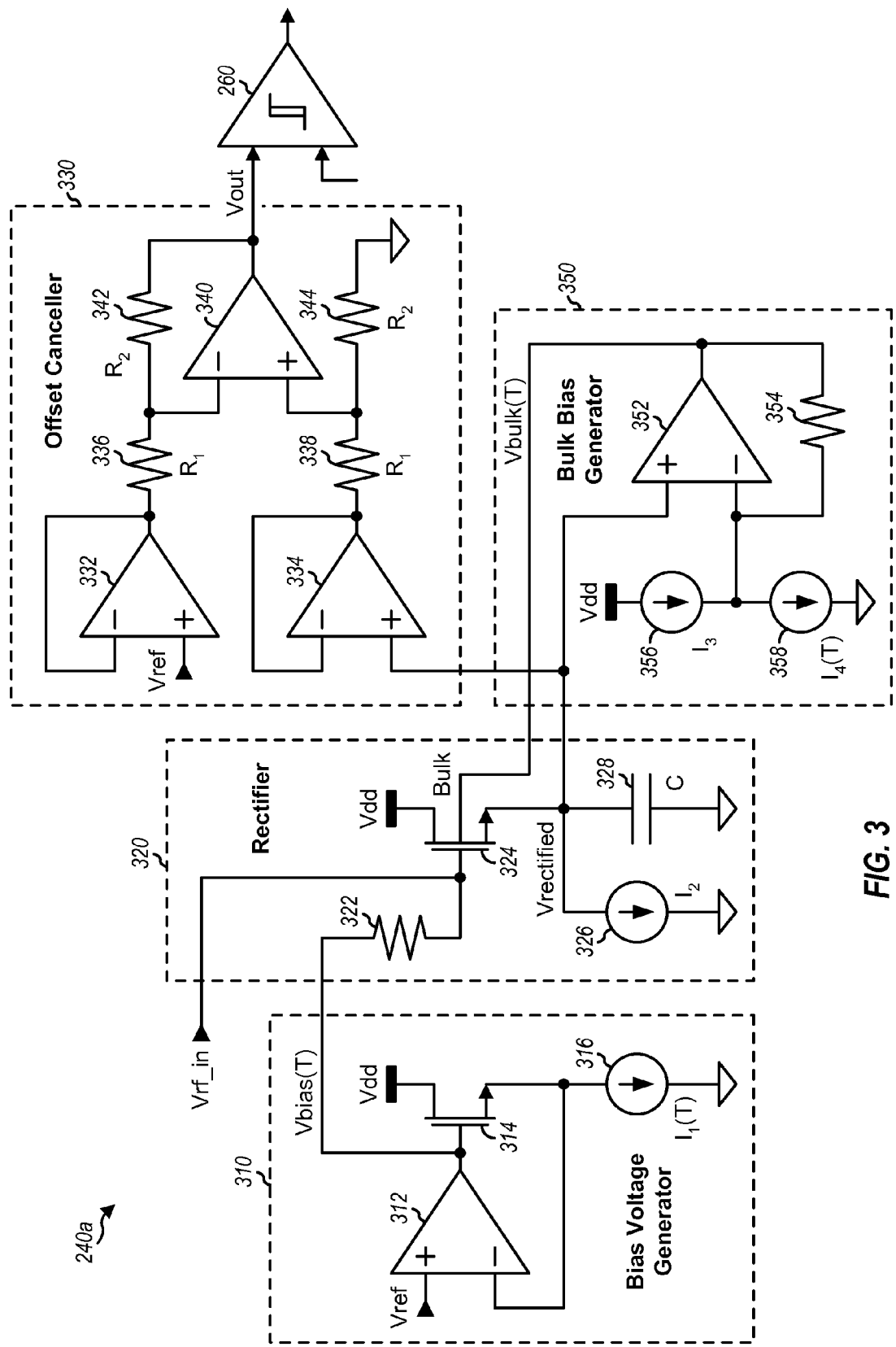
FIG. 3 shows a schematic diagram of a single-ended peak detector.

FIG. 3 shows a schematic diagram of an exemplary design of peak detector 240a in FIG. 2A for a single-ended input RF signal, Vrf_in. In this exemplary design, peak detector 240a includes a bias voltage generator 310, a rectifier 320, an offset canceller 330, and a bulk bias generator 350.

Within bias voltage generator 310, an operational amplifier (op-amp) 312 and an N-channel metal oxide semiconductor (NMOS) transistor 314 are coupled as a unity gain buffer to apply a reference voltage, Vref, across a current source 316. Op-amp 312 has its non-inverting input receiving the reference voltage, its inverting input coupled to the source of NMOS transistor 314, and its output coupled to the gate of NMOS transistor 314. NMOS transistor 314 has its drain coupled to a power supply voltage, Vdd. Current source 316 is coupled between the source of NMOS transistor 314 and circuit ground and provides a temperature-dependent current of $I_1(T)$, where T denotes temperature. Op-amp 312 provides a temperature-dependent bias voltage of Vbias(T).

Within rectifier 320, a resistor 322 has one end receiving the Vbias(T) voltage and the other end coupled to the gate of an NMOS transistor 324, which has its drain coupled to the Vdd supply. NMOS transistor 324 also receives the input RF signal at its gate and provides a rectified voltage, Vrectified, at its source. The input RF signal observes a high-pass filter formed by capacitors 222, 224 and 226 in FIG. 2A and resistor 322 in FIG. 3. A capacitor 328 and a current source 326 are coupled between the source of NMOS transistor 324 and circuit ground. Current source 326 provides a temperature-independent current of $I_2$.

Within offset canceller 330, an op-amp 332 operates as a unity gain buffer and has its inverting input coupled to its output and its non-inverting input receiving the Vref voltage. An op-amp 334 also operates as a unity gain buffer and has its inverting input coupled to its output and its non-inverting input receiving the rectified voltage. A resistor 336 is coupled between the output of op-amp 332 and the inverting input of an op-amp 340. A resistor 338 is coupled between the output of op-amp 334 and the non-inverting input of op-amp 340. A resistor 342 is coupled between the inverting input and the output of op-amp 340, which provides the Vout voltage. A resistor 344 is coupled between the non-inverting input of op-amp 340 and circuit ground.

Within bulk bias generator 350, an op-amp 352 has its non-inverting input receiving the rectified voltage and its output providing a temperature-dependent bulk voltage of Vbulk(T) for NMOS transistor 324. A resistor 354 is coupled between the inverting input and the output of op-amp 352. A current source 356 is coupled between the Vdd supply and the inverting input of op-amp 352. A current source 358 is coupled between the inverting input of op-amp 352 and circuit ground. Current source 356 provides a temperature-independent current of $I_3$, and current source 358 provides a temperature-dependent current of $I_4(T)$.

In the presence of the input RF signal, NMOS transistor 324 acts as a rectifying forward-biased diode and commutates charge on to capacitor 328 to obtain a positive rectified voltage. To make the charge transfer onto capacitor 328 bi-directional, current source 326 acts as a constant current sink such that rectifier 320 can response to a time-varying waveform. The input RF signal may include a continuum of modulation frequencies within the system bandwidth, which may be up to 20 MHz for some systems. The capacitance C of capacitor 328 and the current $I_2$ of current source 326 may be selected such that the highest amplitude and rate of change of voltage (dv/dt) of the modulated envelope on the input RF signal can be followed and tracked. The resulting rectified voltage on capacitor 328 is provided to high input impedance voltage buffer 334 to prevent charge leakage from capacitor 328.

It is desirable for the rectified voltage to be a linear function of the input RF signal and to be independent of temperature. A DC operating point of the rectified voltage is dependent on a gate-to-source voltage, Vgs, of NMOS transistor 324, which is in turn dependent on a threshold voltage, Vt, and the mobility of NMOS transistor 324 over IC process and temperature. An AC component of the rectified voltage is dependent on the turn-on potential of NMOS transistor 324 based on the input voltage at the gate relative to the source and the DC operating point.

The threshold voltage is the voltage at which a MOS transistor starts to turn on. The threshold voltage and the mobility typically vary over temperature and IC process. The gate of NMOS transistor 324 is biased with the Vbias(T) voltage via resistor 322. The Vbias(T) voltage varies with temperature to compensate for variation of the threshold voltage and the mobility of NMOS transistor 324 with temperature. This results in the DC operating point of the rectified voltage having small or no variation versus temperature.

Figure 4A:
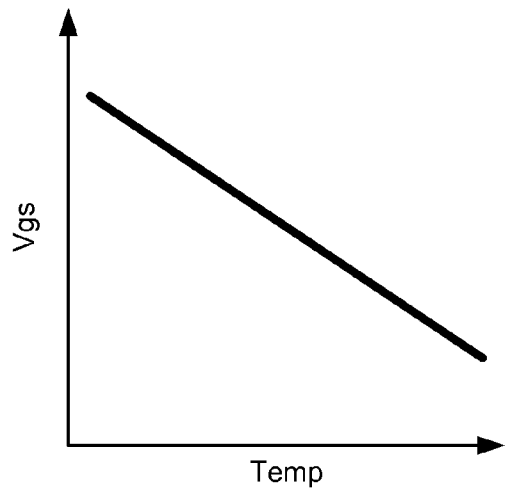
FIGS. 4A to 4D show plots of various voltages versus temperature.

FIG. 4A shows a plot of the Vgs voltage of NMOS transistor 324. The Vgs voltage has a negative slope with temperature. The slope may be dependent on variation in the threshold voltage and the mobility of NMOS transistor 324 with temperature. Without temperature compensation, the rectified voltage may vary over temperature in a similar manner as the Vgs voltage.

Figure 4B:
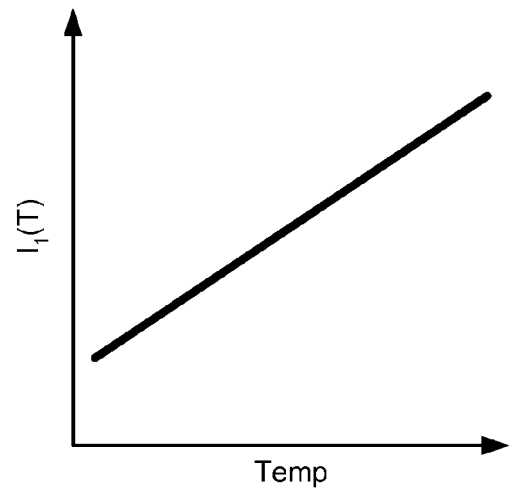

FIG. 4B shows a plot of the $I_1(T)$ current from current source 316 in FIG. 3. The $I_1(T)$ current has a positive slope with temperature. The slope may be controlled to achieve cancellation of temperature dependent changes in the rectified voltage.

Figure 4C:
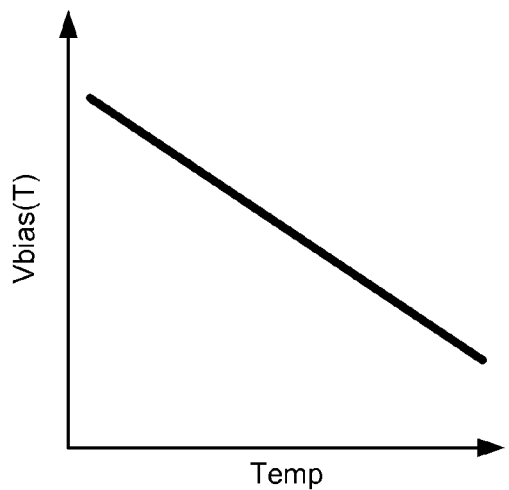

FIG. 4C shows a plot of the Vbias(T) voltage for NMOS transistor 324. The Vbias(T) voltage has a negative slope with temperature. The slope of the Vbias(T) voltage may be designed to match the slope of the Vgs voltage in order to cancel out variation over temperature. The slope of the Vbias (T) voltage may be varied with the slope of the $I_1(T)$ current to match the slope of the Vgs voltage.

Figure 4D:
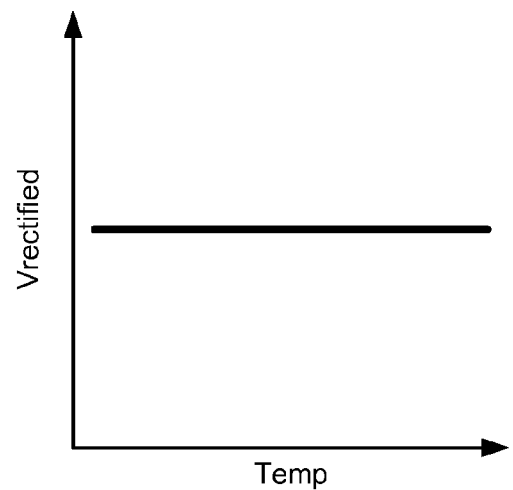

FIG. 4D shows a plot of the source voltage of NMOS transistor 324 with temperature compensation. The source voltage is also the DC operating point of the rectified voltage with no input RF signal. The Vbias(T) voltage counters the variations in the Vgs voltage and the mobility of NMOS transistor 324 with temperature. This may then result in the rectified voltage being essentially independent of temperature. Without temperature compensation, the DC operating point of the rectified voltage would decrease with temperature.

When no input RF signal is applied, the rectified voltage at the source of NMOS transistor 324 is approximately equal to the voltage at the source of NMOS transistor 314, which is equal to the Vref voltage.

In the exemplary design shown in FIG. 3, the Vbias(T) voltage is generated and applied outside of the input RF signal path to compensate for variations due to temperature. In particular, the Vbias(T) voltage is isolated from output circuit 150 via resistor 322, which may be a relatively high impedance. The Vbias(T) voltage may thus compensate for temperature while minimally affecting the performance of the signal path.

Offset canceller 330 receives and buffers the Vref voltage and the rectified voltage with buffers 332 and 334, respectively. Offset canceller 330 also subtracts the Vref voltage from the rectified voltage, amplifies the resultant voltage, and provides the Vout voltage. Buffers 332 and 334 may be matched so that the residual input offset voltage of each amplifier can be canceled through differential amplifier 340. The gain of amplifier 340 is determined by the $R_1$ and $R_2$ values of resistors 336, 338, 342 and 344. The gain may be set to maximize the sensitivity of peak detector 240a by utilizing the available voltage headroom based on the Vdd supply.

Peak detector 240 should provide the Vout voltage based on a temperature independent linear function of the input RF signal, which is a scaled version of the output RF signal. Peak detector 240 may be calibrated when power amplifier 140 is operating with the nominal load impedance and the input RF signal is relatively small. Programmable thresholds for overdrive conditions may be set for comparator 260 based on the linear function. Hence, more accurate detection of overdrive conditions may be achieved with more accurate detection of the peak voltage of the input RF signal and more accurate programmable thresholds, both of which may be achieved with more accurate characterization of the linear function of peak detector 240.

Figure 5:
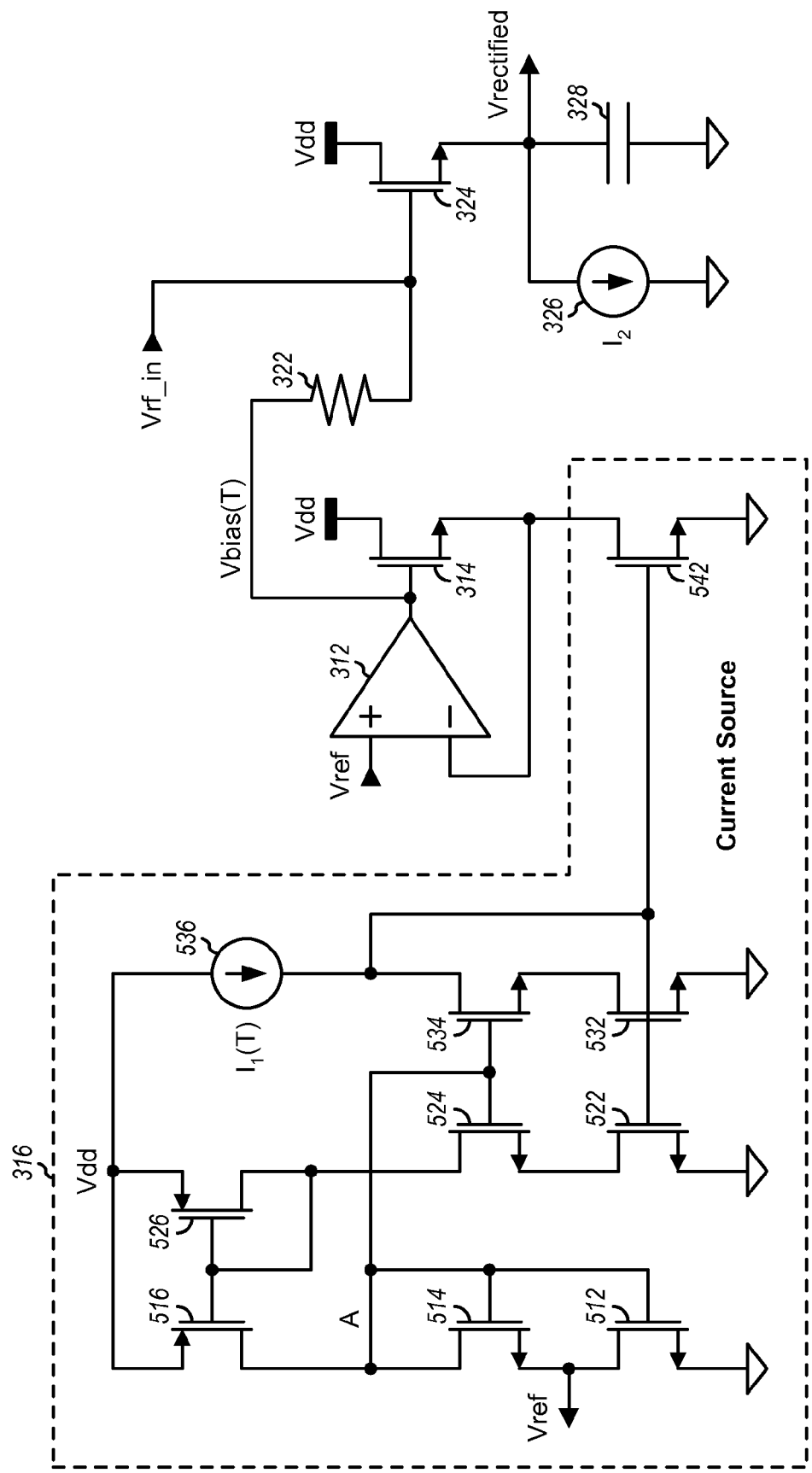
FIG. 5 shows a schematic diagram of a current source within the peak detector.

FIG. 5 shows a schematic diagram of an exemplary design of current source 316 within bias voltage generator 310 in FIG. 3. Within current source 316, a NMOS transistor 512 has its source coupled to circuit ground, its gate coupled to node A, and its drain coupled to the source of an NMOS transistor 514. The gate and drain of NMOS transistor 514 are coupled to node A. NMOS transistors 522, 532 and 542 have their sources coupled to circuit ground and their gates coupled together. The drain of NMOS transistor 542 is coupled to the source of NMOS transistor 314. An NMOS transistor 524 has its source coupled to the drain of NMOS transistor 522, its gate coupled to node A, and its drain coupled to the drain of a P-channel MOS (PMOS) transistor 526. An NMOS transistor 534 has its source coupled to the drain of NMOS transistor 532 and its gate coupled to node A. A current source 536 is coupled between the Vdd supply and the drain of NMOS transistor 534. PMOS transistors 516 and 526 have their sources coupled to the Vdd supply, and their gates coupled together and to the drain of PMOS transistor 526. The drain of PMOS transistor 516 is coupled to node A. The Vref voltage is generated at the source of NMOS transistor 514. Since the Vref voltage is generated by a MOS replica of NMOS transistor 324, this may help maintain a consistent Vout voltage from offset canceller 330 due to IC process variations.

NMOS transistors 512 and 514 form a diode-connected self-bias stage that biases the gates of NMOS transistors 524 and 534. NMOS transistors 532 and 534 form a cascode current mirror that biases the gates of NMOS transistors 522 and 542. Through feedback action of op-amp 312, the voltage at the source of NMOS transistor 314 may be held very low and still be active. This DC operating condition is also achieved at the source of NMOS transistor 324. This may maximize the peak detection range of rectifier 320 for a given Vdd voltage.

The threshold voltage/operating point may vary over IC process based on the Vgs voltage drop at NMOS transistor 514. NMOS transistor 324 may be matched to NMOS transistor 514 (not necessarily in size, but with similar current density) and may then observe a similar DC voltage drop or variation in bias voltage at the source of NMOS transistor 324.

Figure 6:
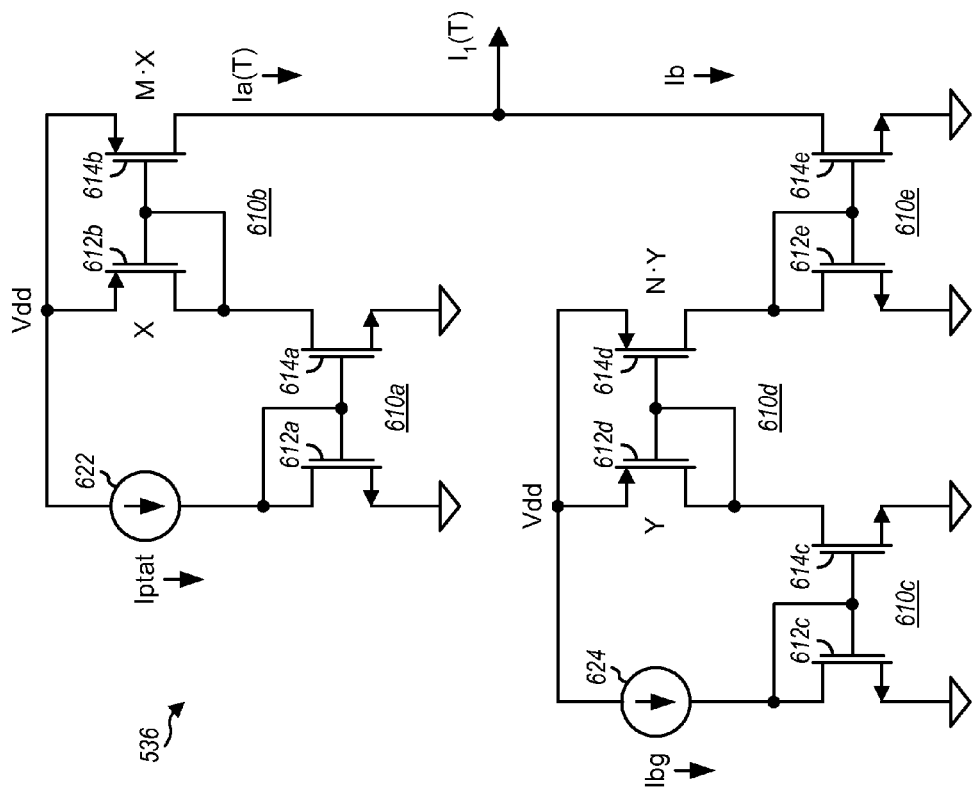
FIG. 6 shows a schematic diagram of a configurable current source.

FIG. 6 shows a schematic diagram of an exemplary design of current source 536 within current source 316 in FIG. 3. Current source 536 includes five current mirrors 610a through 610e. Each current mirror 610 includes two MOS transistors 612 and 614 having their sources coupled to either circuit ground or the Vdd supply and their gates coupled together and to the drain of MOS transistor 612.

Current mirrors 610a and 610b are coupled together, with the drain of NMOS transistor 614a being coupled to the drain of PMOS transistor 612b. A current source 622 is coupled between the Vdd supply and the drain of NMOS transistor 612a and provides a current of Iptat, which is proportional to absolute temperature (PTAT). NMOS transistors 612a and 614a have the same size, and PMOS transistor 614b is M times the size of PMOS transistor 612b, where M may be an integer or non-integer value. PMOS transistor 614b provides a temperature-dependent current of Ia(T)=M×Iptat.

Current mirrors 610c, 610d and 610e are coupled together, with the drain of NMOS transistor 614c being coupled to the drain of PMOS transistor 612d, and the drain of PMOS transistor 614d being coupled to the drain of NMOS transistor 612e. A current source 624 is coupled between the Vdd supply and the drain of NMOS transistor 612c and provides a current of Ibg. The Ibg current may be generated based on a bandgap reference and may thus be independent of temperature. NMOS transistors 612c and 614c have the same size, NMOS transistors 612e and 614e have the same size, and PMOS transistor 614d is N times the size of PMOS transistor 612d, where N may be an integer or non-integer value. NMOS transistor 614e provides a temperature-independent current of Ib=N×Ibg. Current source 536 provides a net current of $I_1(T)=Ia(T)-Ib$. The $I_1(T)$ current may also be generated with other circuit designs.

Figure 7:
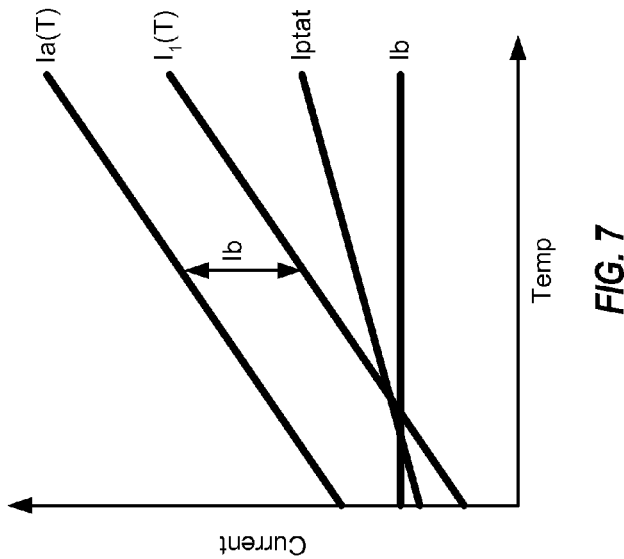
FIG. 7 shows plots of various currents versus temperature.

FIG. 7 shows plots of various currents within current source 536 in FIG. 6. The Iptat current may be a linear function of temperature. The Ia(T) current from PMOS transistor 614b may also be a linear function of temperature but may have a different slope determined based on the transistor size ratio M. The Ibg current and the Ib current may both be a constant function of temperature. The $I_1(T)$ current may be a shifted version of the Ia(T) current, with the amount of shift being determined by the Ib current. The slope of the $I_1(T)$ current may thus be controlled based on the transistor size ratio M for current mirror 610b. The intercept point of the $I_1(T)$ current may be controlled based on the transistor size ratio N for current mirror 610d. The transistor size ratios M and N may be selected to achieve temperature-independent detection of signal peak by rectifier 320 in FIG. 3.

Referring back to FIG. 3, the Vbias(T) voltage is equal to the Vref voltage plus the Vgs voltage of NMOS transistor 314. The rectified voltage from NMOS transistor 324 comprises a DC component equal to the Vref voltage and an AC component determined by the input RF signal. Within offset canceller 330, the Vref voltage and the rectified voltage are buffered by op-amps 332 and 334 and further driven through differential amplifier 340, which cancels the common-mode Vref voltage. FIG. 3 shows an exemplary design in which the Vref voltage is applied to the non-inverting input of op-amp 332 and canceled from the rectified voltage. In another exemplary design, NMOS transistor 324 and current source 326 may be replicated, the Vbias(T) voltage may be applied to the gate of the replicated NMOS transistor, and the source of the replicated NMOS transistor may be coupled to the non-inverting input of op-amp 332. This may allow for cancellation of shifts in the DC operating point of the Vout voltage due to threshold voltage variations of NMOS transistor 324 over IC process variations.

Bulk bias generator 350 generates the Vbulk(T) voltage, which is applied to the bulk of NMOS transistor 324. The Vbulk(T) voltage results in the bulk and the source of NMOS transistor 324 being virtually connected at high temperature. This will provide faster operation at high temperature and large signal swing of the input RF signal and will compensate for an inherently slower operation of NMOS transistor 324 due to degradation in electron mobility at high temperature.

Figure 8:
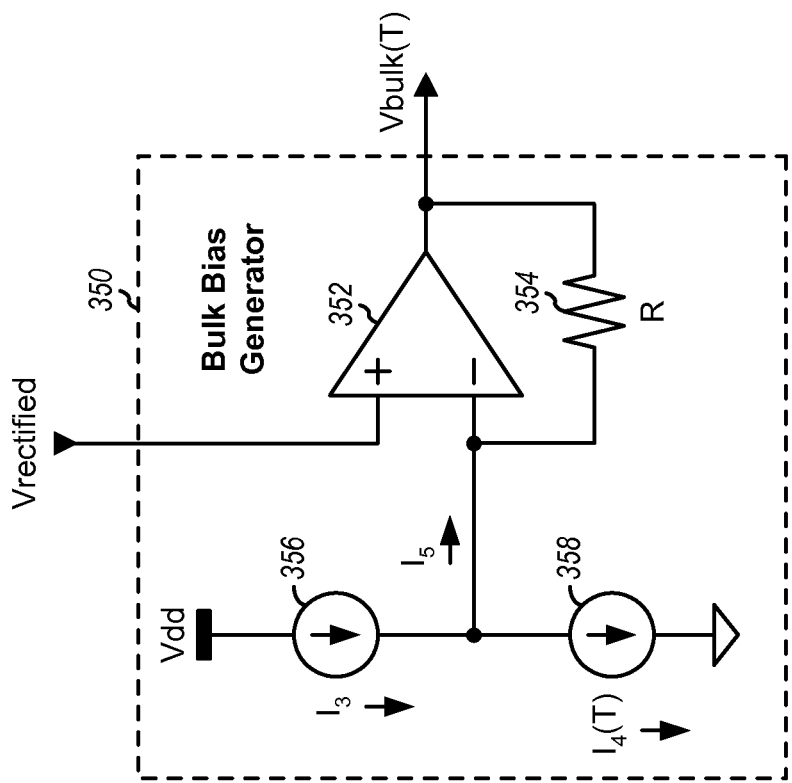
FIG. 8 shows a block diagram of a bulk bias generator.

FIG. 8 shows the operation of bulk bias generator 350. The rectified voltage is coupled to the non-inverting input of op-amp 352 and used to generate the Vbulk(T) voltage, which has a variable voltage level determined by the rectified voltage. The Vbulk(T) voltage may also be filtered.

Figure 9:
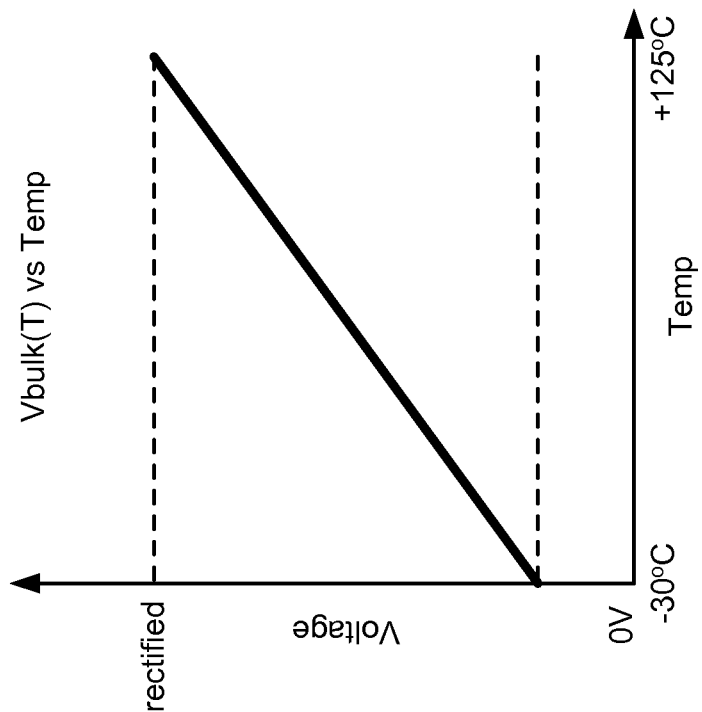
FIG. 9 shows a plot of a bulk voltage versus temperature.

FIG. 9 shows a plot of the Vbulk(T) voltage versus temperature. At high temperature (e.g., 125° Celsius), the $I_3$ current from current source 356 is approximately equal to the $I_4(T)$ current from current source 358. Small or no current (or $I_5 \approx 0$) flows through resistor 354, op-amp 352 operates as a voltage follower, and the Vbulk(T) voltage is approximately equal to the rectified voltage applied to the non-inverting input of op-amp 352. The bulk of NMOS transistor 324 would then track the rectified voltage, and the bulk and the source of NMOS transistor 324 would be virtually connected. At low temperature (e.g., −30° Celsius), the $I_3$ current from current source 356 is greater than the $I_4(T)$ current from current source 358. A current of $I_5=I_3-I_4(T)$ flows through resistor 354, and the Vbulk(T) voltage is reduced by a voltage drop of $R \times I_5$ across resistor 354. The bulk of NMOS transistor 324 would then be biased near ground, or lower than the voltage at the source of NMOS transistor 324, at low temperature.

Figure 10:
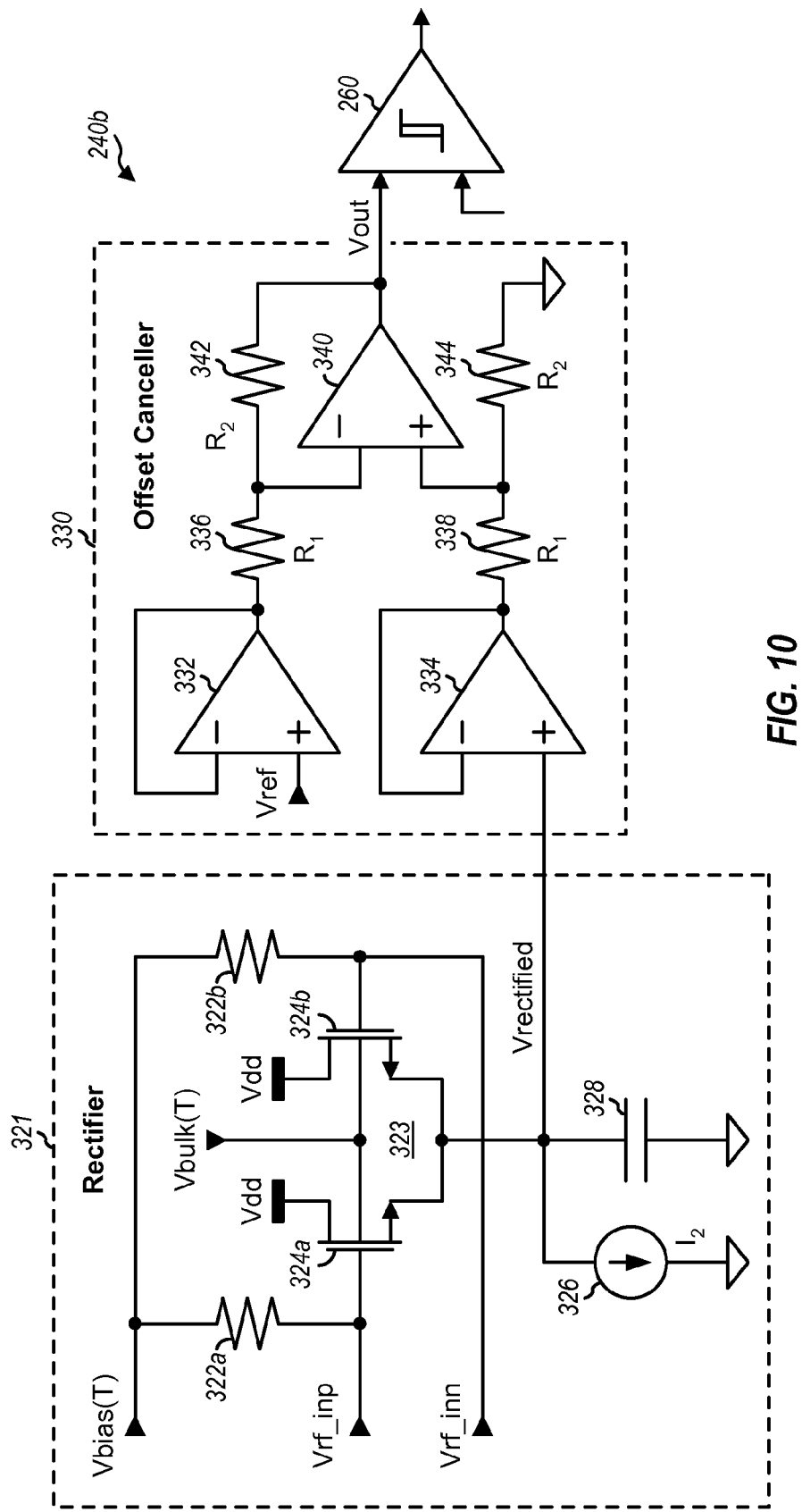
FIG. 10 shows a schematic diagram of a differential peak detector.

FIG. 10 shows a schematic diagram of an exemplary design of peak detector 240b in FIG. 2B for a differential input RF signal comprising the Vrf_inp signal and the Vrf_inn signal. In this exemplary design, peak detector 240b includes a rectifier 321 and offset canceller 330. Peak detector 240b further includes bias voltage generator 310 and bulk bias generator 350 in FIG. 3, which are not shown in FIG. 10 for simplicity.

Rectifier 321 includes a differential pair 323 implemented with NMOS transistors 324a and 324b. The sources of NMOS transistors 324a and 324b are coupled together, and the drains are coupled to the Vdd supply. The gate of NMOS transistor 324a receives the Vrf_inp signal, and the gate of NMOS transistor 324b receives the Vrf_inn signal. Resistors 322a and 322b have one end receiving the Vbias(T) voltage and the other end coupled to the gates of NMOS transistors 324a and 324b, respectively. Capacitor 328 and current source 326 are coupled in parallel and between the sources of NMOS transistors 324a and 324b and circuit ground. The sources of NMOS transistors 324a and 324b provide the rectified voltage, Vrectified.

Offset canceller 330 receives the Vrectified voltage from rectifier 321 and the Vref voltage and provides the Vout voltage. Bias voltage generator 310 generates the Vbias(T) voltage, which is provided to the gates of NMOS transistors 324a and 324b via resistors 322a and 322b, respectively. Bulk bias generator 350 generates the Vbulk(T) voltage, which is provided to the bulk of NMOS transistors 324a and 324b.

In an exemplary design, an apparatus may comprise a bias voltage generator and a first MOS transistor, e.g., bias voltage generator 310 and NMOS transistor 324 in FIG. 3. The bias voltage generator may provide a bias voltage (e.g., Vbias(T)) as a function of temperature. The first MOS transistor may receive an input RF signal and the bias voltage and may provide a rectified signal. The rectified signal may be a linear function of the input RF signal and may have reduced deviation with temperature due to the bias voltage. A resistor may be coupled between the bias voltage generator and the gate of the first MOS transistor. The resistor may provide the bias voltage to the first MOS transistor and may also provide isolation between the bias voltage generator and the input RF signal. A capacitor (e.g., capacitor 328) may be coupled to the source of the first MOS transistor and may provide the rectified signal. A current source (e.g., current source 326) may be coupled in parallel with the capacitor. The capacitor and the current source may have values selected based on the bandwidth of the input RF signal.

In an exemplary design, the bias voltage generator may comprise an op-amp, a second MOS transistor, and a current source, e.g., as shown in FIG. 3. The op-amp may have a non-inverting input receiving a reference voltage and an output providing the bias voltage. The second MOS transistor may have its gate coupled to the output of the op-amp and its source coupled to an inverting input of the op-amp. The current source may be coupled to the source of the second MOS transistor. In an exemplary design, the current source may comprise first and second current sources, e.g., current sources 622 and 624 in FIG. 6. The first current source may provide a first current (e.g., Iptat) as function of temperature. The second current source may provide a second current (e.g., Ibg) that is not a function of temperature. The bias voltage may be dependent on the first and second currents. The bias voltage generator may generate the bias voltage based on a temperature-dependent current (e.g., $I_1(T)$), which may have a slope selected to reduce deviation in the rectified signal with temperature. The temperature-dependent current may be generated based on the first and second currents, possibly with scaling to obtain the desired slope and intercept point for the temperature-dependent current.

In an exemplary design, an offset canceller may be coupled to the first MOS transistor and may cancel the reference voltage from the rectified signal and provide an output voltage. The output voltage may be a linear function of the input RF signal and may have reduced deviation with temperature due to the bias voltage. Another MOS transistor (which may be a replica of the first MOS transistor) may generate the reference signal for the offset canceller. The offset canceller may provide a gain to extend a range of the output signal.

In an exemplary design, a bulk bias generator may generate a bulk voltage as a function of temperature. The bulk voltage may be applied to a bulk of the first MOS transistor. The bulk voltage may result in progressively smaller bulk-to-source voltage for the first MOS transistor for progressively higher temperature to improve operating speed of the first MOS transistor at higher temperature. The bulk bias generator may comprise an op-amp providing the bulk voltage, first and second current sources, and a resistor coupled between the inverting input and the output of the op-amp. The first current source may be coupled to the inverting input of the op-amp and may provide a first current (e.g., $I_3$) that is independent of temperature. The second current source may be coupled to the inverting input of the op-amp and may provide a second current (e.g., $I_4(T)$) as a function of temperature.

A power amplifier may provide an output RF signal. Multiple capacitors may be coupled in series and may receive the output RF signal and provide the input RF signal. The multiple capacitors may form a voltage divider and may provide an attenuated version of the output RF signal as the input RF signal.

For a differential design, e.g., as shown in FIG. 10, a second MOS transistor (e.g., NMOS transistor 324b) may be coupled to the first NMOS transistor as a differential pair, may receive a complementary input RF signal and the bias voltage, and may provide the rectified signal. The offset canceller may receive the rectified signal from the differential pair and may provide the output voltage.

A DAC may receive a digital control and generate a threshold voltage. A comparator may receive the threshold voltage and the output voltage, compare the output voltage against the threshold voltage, and provide a status signal based on comparison result. The DAC may provide a programmable threshold voltage determined based on the digital control.

Figure 11:
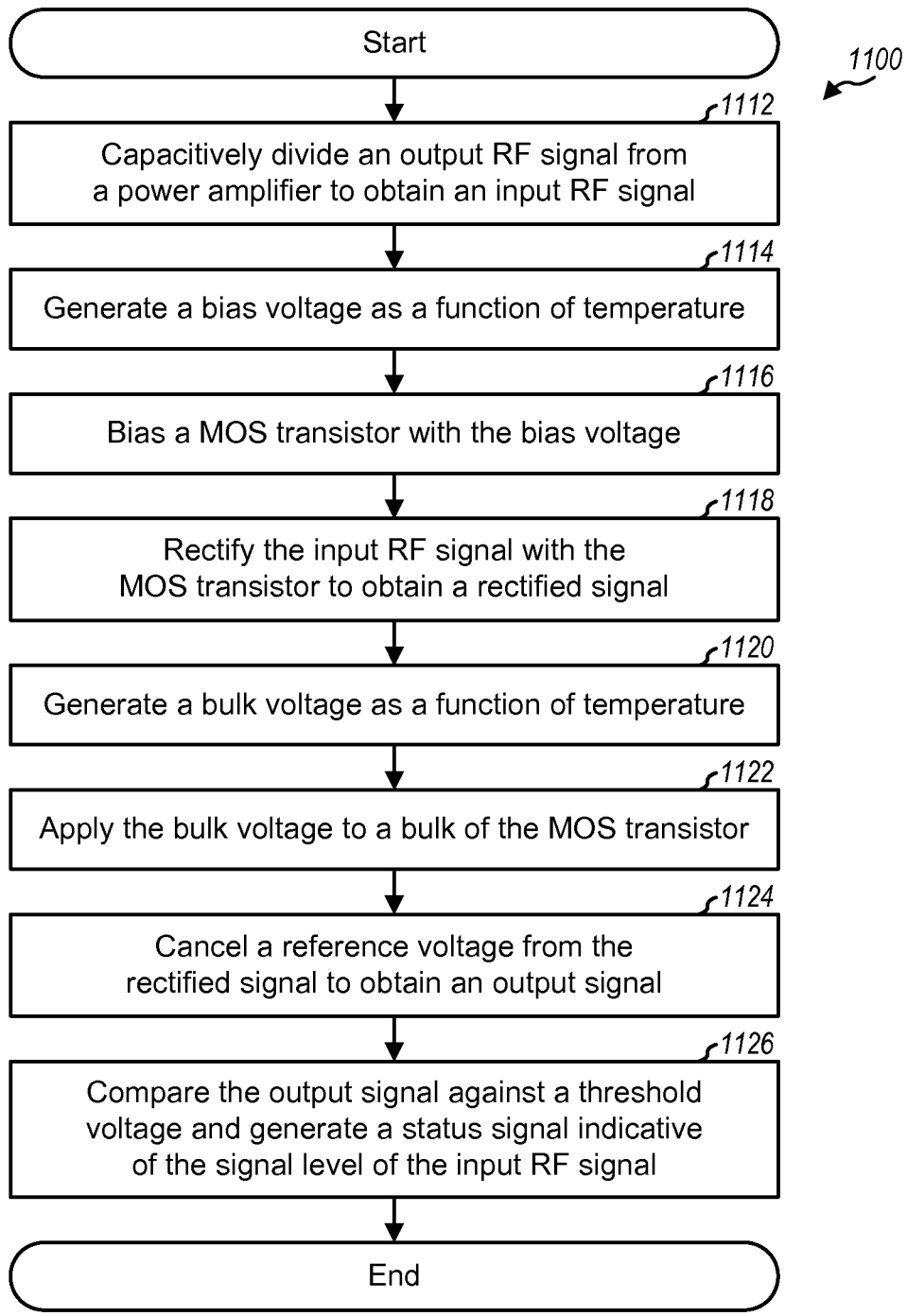
FIG. 11 shows a process for performing peak detection.

FIG. 11 shows an exemplary design of a process 1100 for performing peak detection. An output RF signal from a power amplifier may be capacitively divided to obtain an input RF signal (block 1112). A bias voltage (e.g., Vbias(T)) may be generated as a function of temperature (block 1114). A MOS transistor may be biased with the bias voltage (block 1116). The input RF signal may be rectified with the MOS transistor to obtain a rectified signal (block 1118). The rectified signal may be a linear function of the input RF signal and may have reduced deviation with temperature due to the bias voltage. In an exemplary design of block 1112, the bias voltage may be generated based on a temperature-dependent current (e.g., $I_1(T)$) having a slope selected to reduce deviation in the rectified signal with temperature. The bias voltage may be generated based on a temperature-dependent current (e.g., Iptat or Ia(T)) and a temperature-independent current (e.g., Ibg or Ib).

A bulk voltage may be generated as a function of temperature (block 1120) and applied to a bulk of the MOS transistor (block 1122). A reference voltage may be canceled from the rectified signal to obtain an output signal (block 1124). The output signal may be a linear function of the input RF signal and may have reduced deviation with temperature due to the bias voltage. The output signal may be compared against a threshold voltage to generate a status signal indicative of the signal level of the input RF signal (block 1126).

The detection circuit described herein may be implemented on an IC, an analog IC, an RFIC, a mixed-signal IC, an ASIC, a printed circuit board (PCB), an electronics device, etc. The detection circuit may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the detection circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. An apparatus comprising:
   a bias voltage generator providing a bias voltage as a function of temperature; and
   a first metal oxide semiconductor (MOS) transistor receiving an input radio frequency (RF) signal and the bias voltage and providing a rectified signal, the rectified signal being a linear function of the input RF signal and having reduced deviation with temperature due to the bias voltage.

2. The apparatus of claim 1, further comprising:
   a resistor coupled between the bias voltage generator and a gate of the first MOS transistor, the bias voltage being provided to the first MOS transistor via the resistor.

3. The apparatus of claim 1, the bias voltage generator comprising
   an operational amplifier (op-amp) having an non-inverting input receiving a reference voltage and an output providing the bias voltage,
   a second MOS transistor having a gate coupled to the output of the op-amp and a source coupled to an inverting input of the op-amp, and
   a current source coupled to the source of the second MOS transistor.

4. The apparatus of claim 3, the current source comprising
   a first current source providing a first current as function of temperature, and
   a second current source providing a second current that is not a function of temperature, the bias voltage being generated based on the first current and the second current.

5. The apparatus of claim 1, the bias voltage generator generating the bias voltage based on a temperature-dependent current having a slope selected to reduce deviation in the rectified signal with temperature.

6. The apparatus of claim 1, further comprising:
   an offset canceller coupled to the first MOS transistor and canceling a reference voltage from the rectified signal and providing an output signal, the output signal being a linear function of the input RF signal and having reduced deviation with temperature due to the bias voltage.

7. The apparatus of claim 6, further comprising:
   a second MOS transistor generating the reference signal for the offset canceller, the second MOS transistor being a replica of the first MOS transistor.

8. The apparatus of claim 6, the offset canceller further providing a gain to extend a range of the output signal.

9. The apparatus of claim 1, further comprising:
   a bulk bias generator generating a bulk voltage as a function of temperature, the bulk voltage being applied to a bulk of the first MOS transistor.

10. The apparatus of claim 9, the bulk voltage resulting in progressively smaller bulk-to-source voltage for the first MOS transistor for progressively higher temperature to improve operating speed of the first MOS transistor at higher temperature.

11. The apparatus of claim 9, the bulk bias generator comprising
    an operational amplifier (op-amp) providing the bulk voltage,
    a first current source coupled to an inverting input of the op-amp and providing a first current independent of temperature,
    a second current source coupled to the inverting input of the op-amp and providing a second current as a function of temperature, and
    a resistor coupled between the inverting input and an output of the op-amp.

12. The apparatus of claim 1, further comprising:
    a capacitor coupled to a source of the first MOS transistor and providing the rectified signal; and
    a current source coupled in parallel with the capacitor.

13. The apparatus of claim 1, further comprising:
    a second MOS transistor coupled to the first MOS transistor as a differential pair, receiving a complementary input RF signal and the bias voltage, and providing the rectified signal.

14. The apparatus of claim 1, further comprising:
    multiple capacitors coupled in series and receiving an output RF signal and providing the input RF signal, the multiple capacitors forming a voltage divider and providing an attenuated version of the output RF signal as the input RF signal.

15. The apparatus of claim 1, further comprising:
    a power amplifier providing an output RF signal, the input RF signal being an attenuated version of the output RF signal.

16. The apparatus of claim 1, further comprising:
    a digital-to-analog converter (DAC) receiving a digital control and generating a threshold voltage; and
    a comparator coupled to the DAC and receiving the threshold voltage and an output signal generated based on the rectified signal, the comparator comparing the output signal against the threshold voltage and providing a status signal based on comparison result.

17. The apparatus of claim 16, the DAC providing a programmable threshold voltage determined based on the digital control.

18. A wireless device comprising:
a power amplifier providing an output radio frequency (RF) signal; and
a peak detector receiving an input RF signal generated based on the output RF signal, the peak detector comprising
a bias voltage generator providing a bias voltage as a function of temperature, and
a metal oxide semiconductor (MOS) transistor receiving the input RF signal and the bias voltage and providing a rectified signal, the rectified signal being a linear function of the input RF signal and having reduced deviation with temperature due to the bias voltage.

19. The wireless device of claim 18, the peak detector further comprising
an offset canceller coupled to the MOS transistor and canceling a reference voltage from the rectified signal and providing an output signal, the output signal being a linear function of the input RF signal and having reduced deviation with temperature due to the bias voltage.

20. The wireless device of claim 18, the peak detector further comprising
a bulk bias generator generating a bulk voltage as a function of temperature, the bulk voltage being applied to a bulk of the MOS transistor.

21. A method comprising:
generating a bias voltage as a function of temperature;
biasing a metal oxide semiconductor (MOS) transistor with the bias voltage; and
rectifying an input radio frequency (RF) signal with the MOS transistor to obtain a rectified signal, the rectified signal being a linear function of the input RF signal and having reduced deviation with temperature due to the bias voltage.

22. The method of claim 21, the generating the bias voltage comprises
generating the bias voltage based on a temperature-dependent current and a temperature-independent current.

23. The method of claim 21, further comprising:
canceling a reference voltage from the rectified signal to obtain an output signal, the output signal being a linear function of the input RF signal and having reduced deviation with temperature due to the bias voltage.

24. The method of claim 21, further comprising:
generating a bulk voltage as a function of temperature; and
applying the bulk voltage to a bulk of the MOS transistor.

25. The method of claim 21, further comprising:
capacitively dividing an output RF signal from the power amplifier to obtain the input RF signal.

26. An apparatus comprising:
means for generating a bias voltage as a function of temperature; and
means for rectifying an input radio frequency (RF) signal to obtain a rectified signal, the means for rectifying being biased with the bias voltage, the rectified signal being a linear function of the input RF signal and having reduced deviation with temperature due to the bias voltage.

* * * * *